US006551866B1

(12) United States Patent
Maeda

(10) Patent No.: US 6,551,866 B1
(45) Date of Patent: Apr. 22, 2003

(54) METHOD OF MANUFACTURING A SEMICONDUCTOR MEMORY DEVICE

(75) Inventor: Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/289,716

(22) Filed: Apr. 12, 1999

(30) Foreign Application Priority Data

Nov. 27, 1998 (JP) .......................................... 10-337658

(51) Int. Cl.⁷ .................... H01L 21/335; H01L 21/8232
(52) U.S. Cl. ........................ 438/143; 438/243; 438/58; 438/402; 438/310; 438/471
(58) Field of Search ................ 438/143, 243, 438/58, 402, 310, 471

(56) References Cited

U.S. PATENT DOCUMENTS 5,094,963 A  *  3/1992  Hiraguchi et al. ............ 437/12

FOREIGN PATENT DOCUMENTS

JP          6-132292       5/1994
JP          10-209167      8/1998

* cited by examiner

*Primary Examiner*—Olik Chaudhuri
*Assistant Examiner*—Khiem Nguyen
(74) *Attorney, Agent, or Firm*—McDermott, Will & Emery

(57) ABSTRACT

A method of manufacturing a semiconductor memory device comprising: a step of forming a storage node in which a conductive layer 7 to be the storage node is formed in the vicinity of single crystalline silicon 3 formed on an insulator 2, a gettering step for conducting heat treatment to the single crystalline silicon 3 after the step of forming the storage node and gettering contaminants contained in the single crystalline silicon 3 by the conductive layer 7 connected to the single crystalline silicon, and a step of forming a gate oxide film 8a on the single crystalline silicon 3 after the step of gettering is provided to thereby obtain a sufficient gettering effect even though the width of an element and/or the thickness of the element is reduced in accordance with microminiaturization of the element.

14 Claims, 11 Drawing Sheets

METHOD OF MANUFACTURING A SEMICONDUCTOR MEMORY DEVICE

BACKGROUND OF THE INVENTION

FILED OF THE INVENTION

The present invention relates to a method of manufacturing a semiconductor memory device, in particular a method of gettering a silicon on insulator (hereinbelow referred to as SOI) element.

DISCUSSION OF BACKGROUND

In recent years, an SOI element formed by arranging an element on a single crystalline silicon formed on an insulator is utilized for promoting a high speed and microminiaturization. Further, it is proposed that a dynamic random access memory (DRAM) is fabricated in combination with a capacitor.

FIGS. 14a, 14b, 15a, and 15b show steps of a method of manufacturing a DRAM cell as an example of a conventional semiconductor memory device utilizing such an SOI element. At first, as shown in FIG. 14a, an SOI substrate obtained by forming an SOI layer 103 made of single crystalline silicon on an insulator 102 arranged on a silicon substrate 101 is prepared and an inter-element isolation 104 made of silicon oxide or the like is formed in a side of the SOI layer 103 on the insulator 102.

In the next, a MOSFET is formed as shown in FIG. 14b, wherein source drain areas 103a and 103b are formed in the SOI layer 103 by injecting impurities; a gate oxide film 108a is formed on a part of the SOI layer 103 between the source drain areas; and a gate electrode 108 is formed on the gate oxide film 108a.

In the next, as shown in FIG. 15a, a trench 105 is formed after forming the above MOSFET in order to fabricate a capacitance in the vicinity of MOSFET; and polycrystalline silicon (hereinbelow, referred to as polysilicon) 107 to be a storage node is formed by depositing polysilicon and patterning it after forming a silicon oxide film 106 by oxidizing an inner wall of the trench 105, whereby a capacitor fabricated by the silicon substrate 101, the silicon oxide film 106 in the trench, and a storage node 107 formed on the silicon oxide film 106 in the trench is obtained.

The polysilicon 107 is formed to extend from an opening portion of the trench 105 and is connected to the source drain area 103b of the SOI layer 103 on the source drain area 103b. In this, the polysilicon 107 to be the storage node is injected with conductive impurities so that the polysilicon becomes conductive.

As described, the DRAM cell is fabricated by forming the insulating layer 109 on the SOI substrate, forming a contact hole 110 in which a conductor is embedded on the source drain area 103a of the SOI layer and connecting the conductor in the contact hole 110 to an aluminum (Al) bit line 111 formed on the insulating layer 109 after forming the MOSFET and the storage node of the capacitor.

Generally, in a case that a MOSFET is formed in single crystalline silicon for making an SOI element, heavy metal atoms such as Fe, Cr, and Ni are mixed to single crystalline silicon and thereby the single crystalline silicon is contaminated by the heavy metal atoms in a step of producing a SOI substrate or a step of forming a source, a drain, or the like before forming a gate oxide film. However, because an insulator existed under the single crystalline silicon in such an SOI element, the heavy metal atoms could not diffuse toward a gettering site of the silicon substrate positioned under the insulator through the insulator, wherein effective gettering was not obtainable.

Accordingly, in the method of manufacturing the semiconductor memory device shown in FIGS. 14a through 15b, heavy metal atoms were contained in single crystalline silicon during steps of producing it and therefore the heavy metal atoms contained in the SOI layer 103 of the single crystalline silicon were taken in a gate oxide film 108a when the gate oxide film 108a is formed to thereby cause leaks in the gate oxide film and failures in dielectric breakdown characteristics, and/or were taken in defects existing in a junction between source drain areas 103a, 103b and a channel area to thereby drop a yield.

It is proposed in, for example, JP-A-10-209167 (hereinbelow referred to as conventional technique 1) and JP-A-6-132292 (hereinbelow referred to as conventional technique 2) as a method of performing gettering that polycrystalline silicon for gettering is newly provided in an SOI layer or on the SOI layer in a semiconductor memory device formed with MOSFET using an SOI element.

In the conventional technique 1, contaminants contained in single crystalline silicon were gettered by a region of polycrystalline silicon by selectively forming the region of polycrystalline silicon for gettering in the single crystalline silicon before forming a gate oxide film.

Further, in the conventional technique 2, contaminants contained in single crystalline silicon was gettered by a polycrystalline silicon film by forming the polycrystalline silicon film for gettering on the single crystalline silicon before forming a gate oxide film. By applying the conventional technique 1 or 2 to the method of manufacturing a semiconductor memory device shown in FIGS. 14a through 15b, it becomes possible to conduct gettering with respect to a DRAM cell utilizing the above SOI element.

However, there were problems that the number of steps of a manufacturing process was increased because it was necessary to newly form polycrystalline silicon for gettering and microminiaturization of an element became difficult because the width of the element and/or the thickness of the element was increased by newly providing a region for gettering in single crystalline silicon and newly forming a film for gettering on the single crystalline silicon.

On the other hand, when the width of the element and/or the thickness of the element was reduced in order to microminiaturize the element, in the conventional technique 1, a region in which a polycrystalline silicon region was formed became narrow as a result of reduction of the width of the element; and in the conventional technique 2, the thickness of the polycrystalline silicon film to be formed became thin as a result of reduction of the thickness of the element, whereby there was a problem that sufficient gettering could not be conducted. Thus, similar problems still remained even though the conventional technique 1 or 2 was applied to the method of manufacturing the semiconductor memory device shown in FIGS. 14a through 15b.

SUMMARY OF THE INVENTION

It is an object of the present invention to solve the above-mentioned problems inherent in the conventional techniques and to provide a method of manufacturing a semiconductor memory device in which a sufficient gettering effect is obtainable even though the width of an element and/or the thickness thereof is reduced along with microminiaturization of the element.

According to a first aspect of the present invention, there is provided a method of manufacturing a semiconductor memory device, in which a MOSFET in single crystalline silicon formed on an insulator and a capacitor including a storage node positioned in the vicinity of the single crystalline silicon are provided, comprising: a step of forming the storage node by forming a conductive layer to be the storage node in the vicinity of the single crystalline silicon formed on the insulator and connecting the conductive layer to the single crystalline silicon, a step of gettering in which the single crystalline silicon is subjected to heat treatment after the step of forming storage node and contaminants contained in the single crystalline silicon are gettered by the conductive layer connected to the single crystalline silicon, and a step of forming a gate oxide film on the single crystalline silicon after the gettering step.

According to a second aspect of the present invention, the above-mentioned capacitor may be a stack-type capacitor having the conductive layer to be the storage node formed on the single crystalline silicon and an upper electrode formed on the conductive layer so as to be opposite to the conductive layer or a trench-type capacitor in which the conductive layer to be the storage node is formed in a trench. Further, in the case of the trench-type capacitor, the conductive layer to be the storage node may be formed like a film in an inner wall of the trench or may be embedded in the trench like a plug.

According to a third aspect of the present invention, a connection between the conductive layer to be the storage node and the single crystalline silicon may be such that the conductive layer is connected to a side surface of the single crystalline silicon and the conductive layer may be further connected to an upper surface of the single crystalline silicon in addition to the side surface thereof.

According to a fourth aspect of the present invention, source drain regions are formed by injecting impurities into the single crystalline silicon before the step of forming the storage node and a gate electrode is formed on a gate oxide film after forming the gate oxide film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIGS. 1 through 15b as follows, wherein the same numerical references are used for the same or the similar portions and description of these portions is omitted.

EMBODIMENT 1

Figure 1:
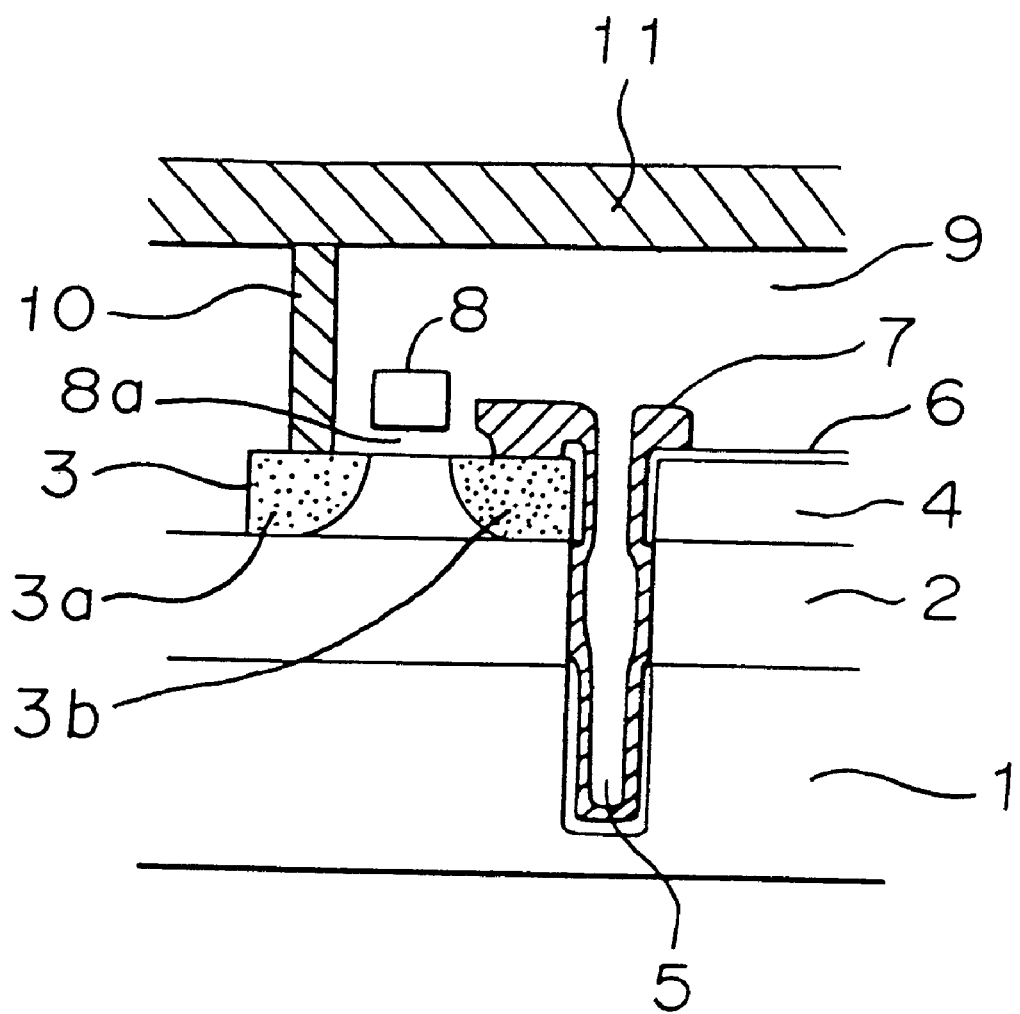
FIG. 1 is a cross-sectional view for schematically showing a semiconductor memory device according to Embodiment 1 of the present invention.

FIG. 1 is a cross-sectional view for schematically showing a semiconductor memory device according to Embodiment 1 of the present invention. As shown in FIG. 1, silicon on insulator (SOI) structure is adopted, wherein an insulator 2 made of silicon oxide ($SiO_2$) is formed on a silicon substrate 1 and single crystalline silicon 3 (hereinbelow referred to as an SOI layer) is formed on the insulator 2.

On the SOI layer 3, source drain areas 3a and 3b of a MOSFET are formed and a gate oxide film 8a and a gate electrode 8 are sequentially provided between the source drain areas to thereby form the MOSFET. Meanwhile, it is possible to form an area having low concentration impurities, namely lightly doped drain (hereinbelow referred to as LDD) by injecting the low concentration impurities in ends of the source drain areas 3a and 3b.

Further, a trench 5 is formed in a portion adjacent to the SOI layer; an insulating film 6 such as silicon oxide film is formed in an inner wall of the trench 5; and a polycrystalline silicon to be a storage node of a trench-type capacitor, such as polysilicon 7, is formed on the silicon oxide film 6 in the inner wall of the trench 5, wherein the trench-type capacitor is formed. One end of the polysilicon 7 extends from the trench 5 and is connected on the source drain area 3b of the SOI layer 3. The polysilicon 7 to be the storage node is injected by conductive impurities to have conductive properties.

An insulating layer 9 such as silicon oxide is formed on the MOSFET and a capacitor, and a conductive layer 11 such as aluminum is formed on the insulating layer 9. Further, a tungsten plug (W plug) 10 is formed in the insulating layer 9 for electrically connecting the source drain area 3a of the SOI layer 3 to the conductive layer 11.

In the next, a method of manufacturing a semiconductor memory device shown in FIG. 1 will be described. FIGS. 2a through 2c and FIGS. 3a through 3c show steps of manufacturing process for explaining a method of manufacturing the semiconductor memory device shown in FIG. 1.

Figure 2A:
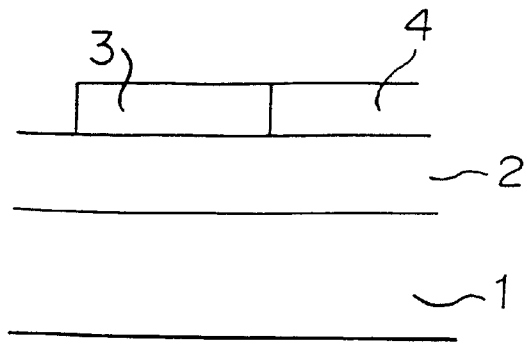
FIGS. 2a through 2c show steps of manufacturing process in a method of manufacturing the semiconductor memory device shown in FIG. 1.

At first, as shown in FIG. 2a, an SOI substrate formed with the SOI layer 3 of single crystalline silicon on the insulator 2 formed on the silicon substrate 1 is prepared and inter-element isolation 4 made of a material such as silicon oxide is formed next to the SOI layer 3 on the insulator 2.

On a back surface of the silicon substrate 1, a gettering site (not shown) is formed. This gettering site is obtainable by forming polysilicon on the back surface of the silicon substrate 1 or by forming a defect portion there on.

Figure 2B:
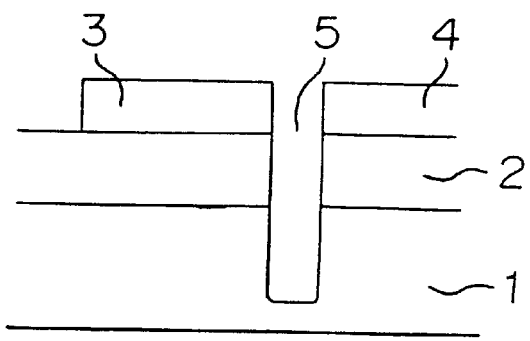

In the next, as shown in FIG. 2b, the trench 5 is formed between the SOI layer 3 and the inter-element isolation 4 on the insulator 2 by etching. At this time, the trench 5 is formed such that at least a tip portion of the trench 5 reaches to the silicon substrate 1 in order to form the trench-type capacitor.

Figure 2C:
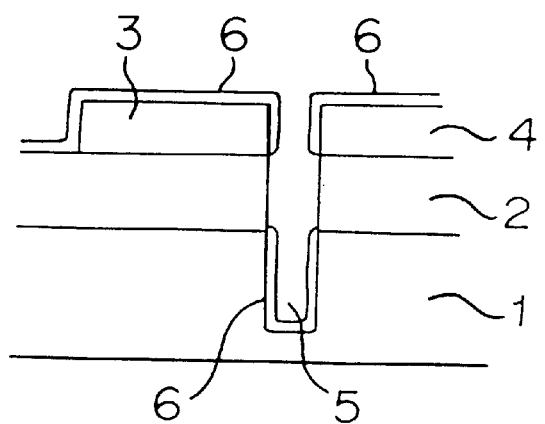

In the next, as shown in FIG. 2c, wet oxidation is conducted under a temperature of 750° C. to form a silicon oxide film 6 having a thickness of about 100 Å on the semiconductor substrate. At this time, the silicon oxide film 6 is formed in the inner wall of the trench 5 and on the SOI layer 3. At this time, impurities such as heavy metals are not taken in the silicon oxide film formed in the silicon substrate 1 and the inner wall of the trench 5. This is because, the impurities such as heavy metals in the silicon substrate 1 are gettered through the gettering site provided in the back surface of the silicon substrate 1.

Figure 3A:
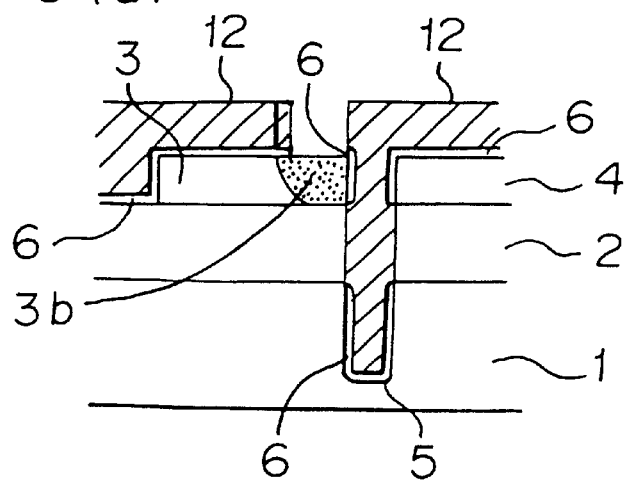
FIGS. 3a through 3c show steps of manufacturing process in the method of manufacturing the semiconductor memory device shown in FIG. 1.

In the next, as shown in FIG. 3a, in order to form the source drain area 3b in a side of the SOI layer 3 formed with the trench 5, an etching process is conducted after forming a resist 12 on the SOI substrate, of which resist 12 is formed with an opening corresponding to the source drain area 3b of the SOI layer 3; a part of the silicon oxide film 6 corresponding to the source drain area 3b is removed; and an opening portion is formed.

Thereafter, the source drain area 3b is formed by injecting impurities from the opening portion. At this time, the impurities to be injected are phosphorus (P), arsenic (As) or the like and a condition for injecting is sufficient for forming a source drain area of MOSFET, for example, $1 \times 10^{15}/cm^2$. Then, the resist 12 is removed after injecting the impurities.

Figure 3B:
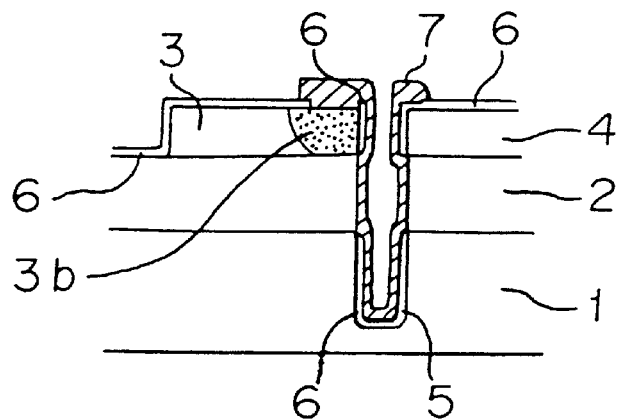

In the next, as shown in FIG. 3b, the storage node is formed by depositing the polysilicon 7 in the trench 5 in which inner wall the silicon oxide film 6 is formed and by patterning the polysilicon 7, wherein the capacitor composed of the silicon substrate 1, the silicon oxide film 6 formed in the inner wall of the trench, and the polysilicon 7 formed on the silicon oxide film 6. A part of the polysilicon 7 is formed so as to extend from the opening portion of the trench 5 to the source drain area 3b of the SOI layer 3.

As such, by forming the polysilicon 7 as the storage node, the SOI layer 3 is in contact with the polysilicon 7 before forming the gate oxide film 6 of the MOSFET on the SOI layer 3. Therefore, the polysilicon 7 to be the storage node works as the gettering site at a time of gettering.

After forming the polysilicon 7 to be the storage node and before forming the gate oxide film 8a, the SOI substrate is subjected to anneal treatment in a range of 600° C. through 1,200° C. In this Embodiment 1, such anneal treatment is conducted under a condition of $N_2$ atmosphere, 700° C. and an hour. Contaminants such as heavy metals contained in the SOI layer 3 are gettered by the polysilicon 7 to be the storage node as a result of the anneal treatment.

Figure 3C:
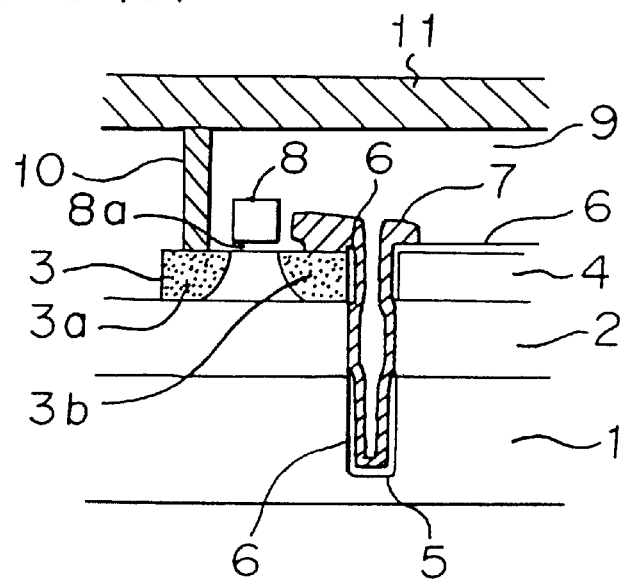

In the next, as shown in FIG. 3c, a part of the silicon oxide film 6 positioned on the SOI layer 3 is removed; the source drain area 3a and the gate oxide film 8a are formed; and thereafter the gate electrode 8 is formed on the gate oxide film 8a. An insulating layer 9 is formed on the SOI substrate after these steps of forming the MOSFET. Further, the tungsten plug (W plug) 10 is formed in the insulating layer 9 so as to be connected to conductive wiring 11 such as Al formed on the insulating layer 9.

As described, the semiconductor memory device shown in FIG. 1 is formed. However, the insulating film of the capacitor may be substituted a silicon oxide film, an oxynitride film, or a material having a high dielectric constant for the silicon oxide film. Further, the storage node may be made of any material such as polysilicon as long as a gettering effect is obtainable.

Because the method of manufacturing a semiconductor memory device according to Embodiment 1 is to make polysilicon to be a storage node composing a capacitor in contact with an SOI layer before forming a gate oxide film and thereafter getter by anneal treatment, the gettering can be conducted without forming an additional part of polycrystalline silicon in the SOI layer or without forming an additional polysilicon film on the SOI layer, whereby microminiaturization of an element is obtainable.

Further, because gettering is conducted by utilizing polysilicon to be a storage node, a region of polycrystalline silicon served for the purpose of gettering is sufficiently prepared, whereby effective gettering can be conducted. Further, because the gettering is conducted utilizing the polysilicon to be the storage node, it is not necessary to newly form polycrystalline silicon, whereby steps of manufacturing process can be made easy.

Further, because gettering is conducted by polysilicon to be a storage node, effects such as reduction of leaks in a gate oxide film, improvement in dielectric breakdown characteristics, and extension of lifetime are obtainable, quality of a semiconductor memory device can be improved.

Further, because leaks in a junction between a source drain area and a channel area can be reduced by gettering, quality of a semiconductor device can be further improved.

EMBODIMENT 2

Figure 4:
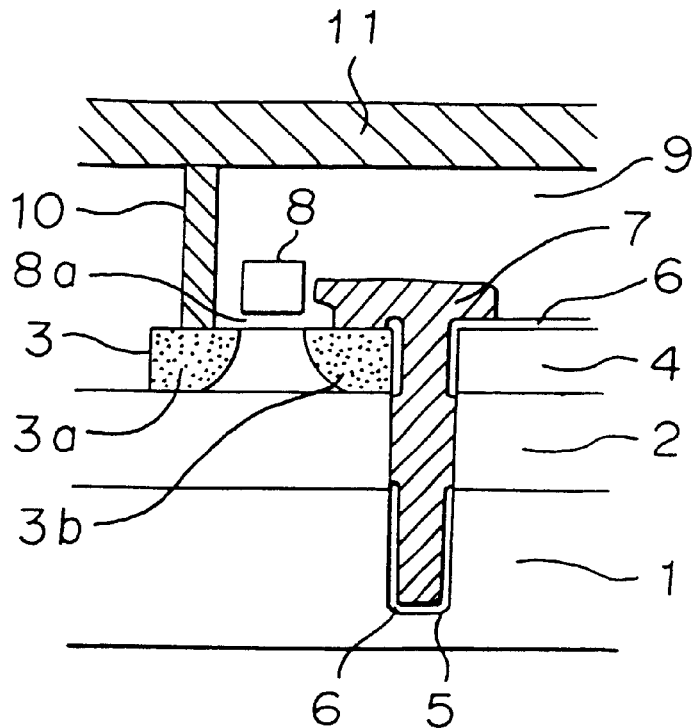
FIG. 4 is a cross-sectional view for schematically showing a semiconductor memory device according to Embodiment 2 of the present invention.

FIG. 4 is a cross-sectional view for schematically showing a semiconductor memory device according to Embodiment 2 of the present invention. In FIG. 1 concerning Embodiment 1 of the present invention, the polysilicon 7 to be the storage node is formed like a film on the silicon oxide film 6 in the inner wall of the trench 5. However, in the semiconductor memory device shown in FIG. 4, polysilicon 7 to be a storage node is embedded in the overall volume of a trench and formed like a plug. The other features are similar to those in FIG. 1 and therefore description is omitted.

In the next, a method of manufacturing the semiconductor memory device shown in FIG. 4 will be described. As for the method of manufacturing, the amount of depositing the polysilicon shown in FIG. 3b is increased in comparison with that of Embodiment 1 so that the polysilicon is sufficiently embedded in the trench. The following steps are similar to those in Embodiment 1 and therefore description is omitted.

Because, in the method of manufacturing the semiconductor memory device in this Embodiment 2, polysilicon to be a storage node embedded in a trench is made in contact with an SOI layer before forming a gate insulating film and thereafter gettering is conducted by anneal treatment, similar effects to those in Embodiment 1 are obtainable. Further, because polysilicon to be a storage node is embedded in a trench, the capacity which gettering deals with is increased, wherein further enhanced gettering effects are obtainable.

EMBODIMENT 3

Figure 5:
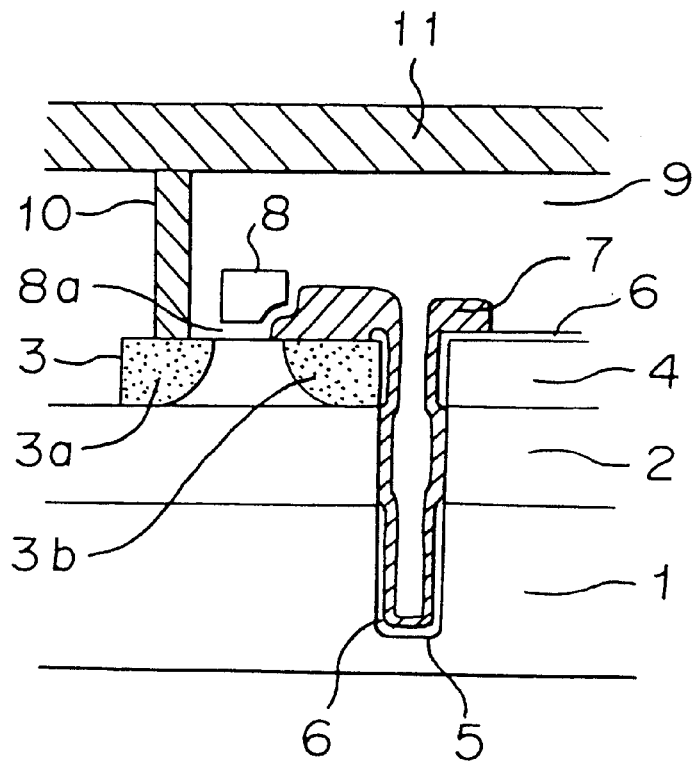
FIG. 5 is a cross-sectional view for schematically showing a semiconductor memory device according to Embodiment 3 of the present invention.

FIG. 5 is a cross-sectional view for schematically showing a semiconductor memory device according to Embodiment 3 of the present invention. In FIG. 1 concerning Embodiment 1, the gate electrode is formed so that the gate electrode is not formed on a portion for connecting the polysilicon 7 to be the storage node to the SOI layer 3. However, in the semiconductor memory device shown in FIG. 5, a gate electrode is formed so that a part of the gate electrode is formed in a portion for connecting a polysilicon 7 to be a storage node to an SOI layer 3. The other features are similar to those in FIG. 1 and therefore description is omitted.

In the next, a method of manufacturing the semiconductor memory device shown in FIG. 5 will be described. At a time of forming the polysilicon shown in FIG. 3b, one end of the polysilicon 7 connected to the SOI layer 3 is formed from an end portion of the SOI layer to a region corresponding to a gate electrode. Thereafter, the part of the gate electrode 8 is formed on the polysilicon 7 at a time of forming the gate electrode. The following steps are similar to those in the manufacturing process in Embodiment 1 and therefore description is omitted.

Figure 6:
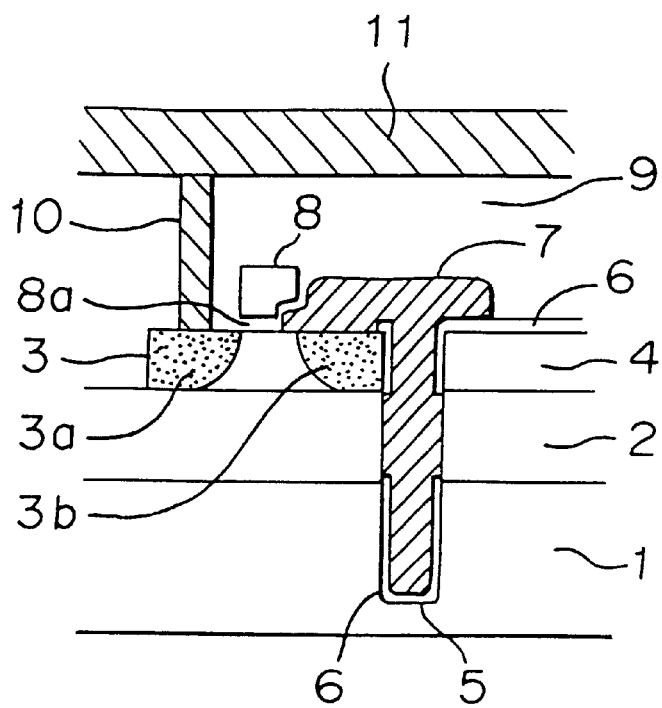
FIG. 6 is a cross-sectional view for schematically showing another semiconductor memory device according to Embodiment 3 of the present invention.

FIG. 6 is a cross-sectional view for schematically showing another semiconductor memory device according to Embodiment 3 of the present invention. Although FIG. 5 shows a structure that the part of the gate electrode is formed on the polysilicon 7 in the structure shown in FIG. 1 concerning Embodiment 1, FIG. 6 shows a structure that a part of a gate electrode is formed on polysilicon 7 to be a storage node in FIG. 4 concerning Embodiment 2. The other features are similar to those in FIG. 4 concerning Embodiment 2 and therefore description is omitted.

In the method of manufacturing the semiconductor memory device according to Embodiment 3, a part of a gate electrode is formed on polysilicon to be a storage node. Therefore, an area of an SOI layer can be further reduced in addition to the effects described in Embodiment 1 or Embodiment 2, whereby a further integrated semiconductor memory device is obtainable.

EMBODIMENT 4

Figure 7:
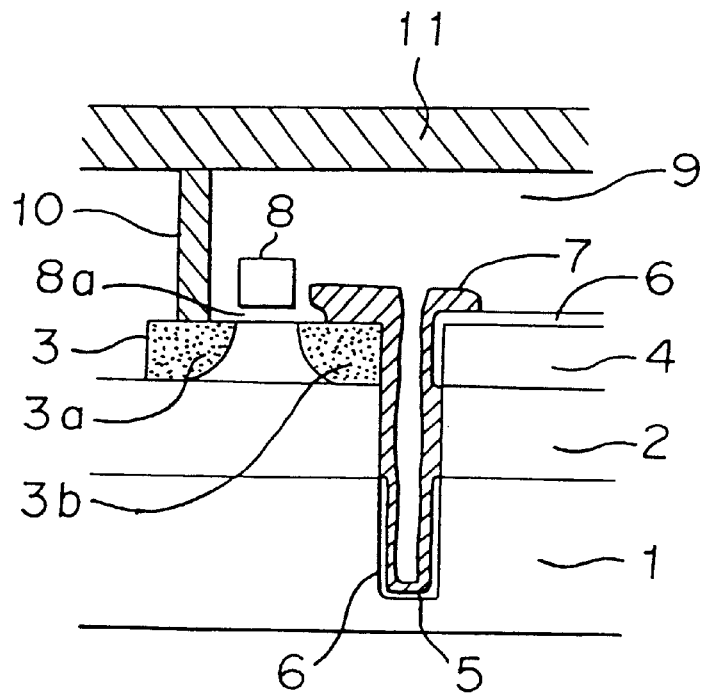
FIG. 7 is a cross-sectional view for schematically showing a semiconductor memory device according to Embodiment 4 of the present invention.

FIG. 7 is a cross-sectional view for schematically showing a semiconductor memory device according to Embodiment 4 of the present invention. Although, in FIG. 1 concerning Embodiment 1, the polysilicon 7 to be the storage node is connected to an upper surface of the SOI layer 3, the semiconductor memory device shown in FIG. 7 has a structure that polysilicon 7 to be a storage node is connected to both an upper surface and a side surface of an SOI layer 3. The other features are similar to those in FIG. 1 and therefore description is omitted.

In the next, a method of manufacturing the semiconductor memory device shown in FIG. 7 will be described. When the source drain area is formed as shown in FIG. 3a, not only a part of the silicon oxide film on the source drain area but also a part of the silicon oxide film in the side wall of the SOI layer 3 are removed by expanding the opening portion wider than the end portion of the SOI layer 3. The following steps are similar to those in the manufacturing process in Embodiment 1 and therefore description is omitted.

When the storage node is formed, the silicon oxide on the side wall of the SOI layer 3 is removed as described. Therefore, an end of the polysilicon 7 to be the storage node is connected not only to the upper portion of the SOI layer 3 but also to the side portion thereof.

Figure 8:
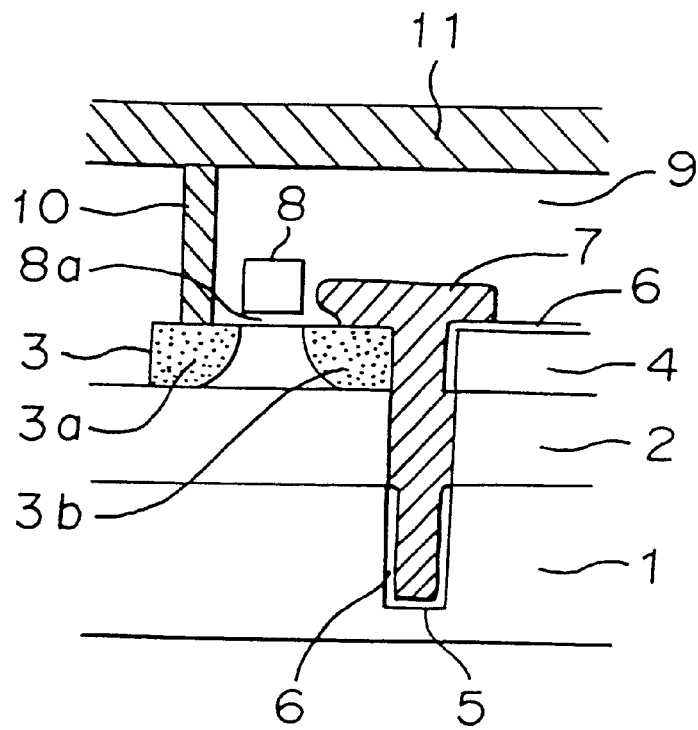
FIG. 8 is a cross-sectional view for schematically showing another semiconductor memory device according to Embodiment 4 of the present invention.

On the other hand, FIG. 8 is a cross-sectional view for schematically showing another semiconductor memory device according to Embodiment 4 of the present invention. Although FIG. 7 shows a structure that the polysilicon 7 to be the storage node is connected to both the upper surface and the side surface of the SOI layer 3 in FIG. 1 concerning Embodiment 1, FIG. 8 shows a structure that polysilicon 7 to be a storage node is connected to both an upper surface and a side surface of an SOI layer 3 in FIG. 4 concerning Embodiment 2. The other features are similar to those in FIG. 4 concerning Embodiment 2 and therefore description is omitted.

Because, in the methods of producing the semiconductor memory device according to this Embodiment 4, a polysilicon to be a storage node is connected to not only an upper surface of single crystalline silicon but also to a side surface thereof, a contacting area is increased and a gettering effect can be enhanced.

Figure 9:
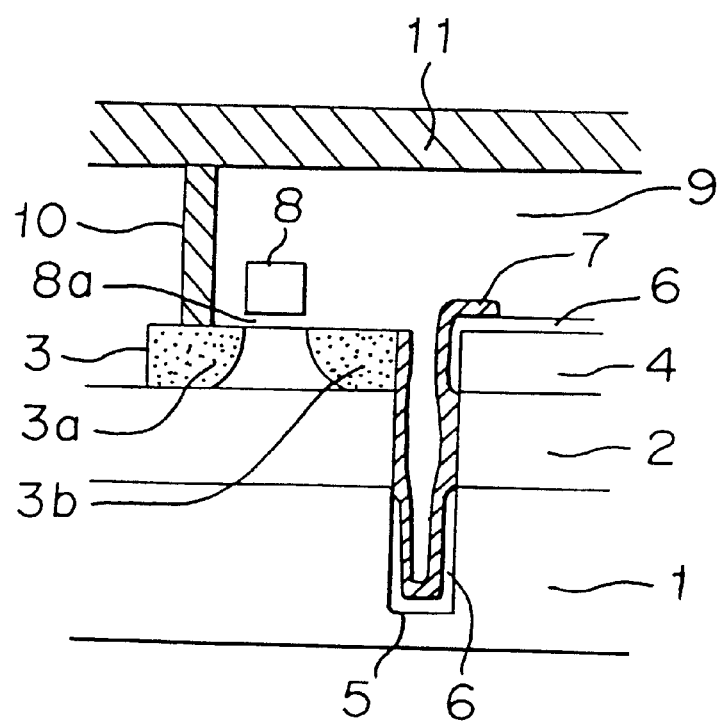
FIG. 9 is a cross-sectional view for schematically showing another semiconductor memory device according to Embodiment 4 of the present invention.
Figure 10:
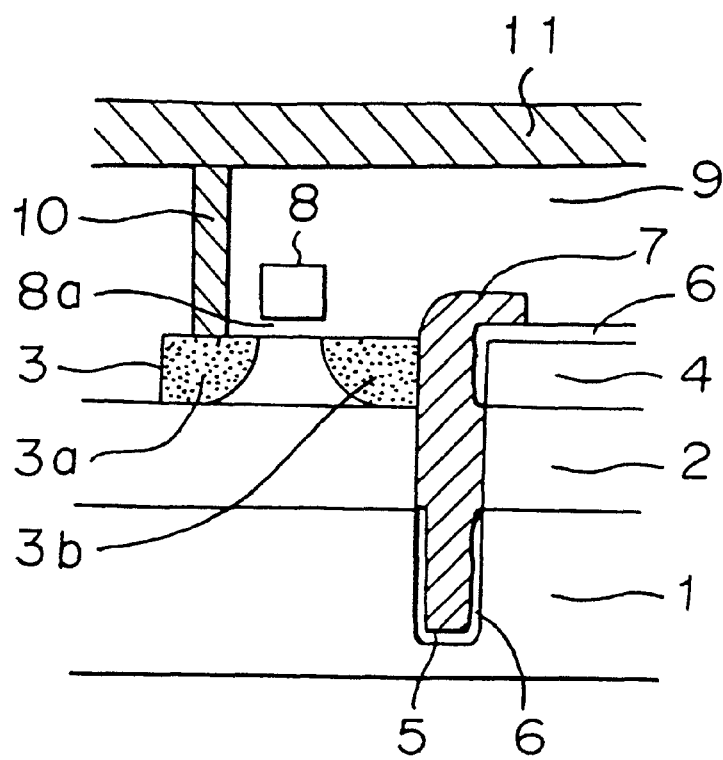
FIG. 10 is a cross-sectional view for schematically showing another semiconductor memory device according to Embodiment 4 of the present invention.

On the other hand, FIGS. 9 and 10 are cross-sectional views for schematically showing other semiconductor memory devices according to Embodiment 4. Although, in FIGS. 7 and 8, the polysilicon 7 to be the storage nodes is connected to the upper surfaces and the side surfaces of the SOI layer 3, FIGS. 9 and 10 show structures that polysilicon 7 to be storage nodes is connected to only side surfaces of SOI layers 3. The other features are similar to those in FIGS. 7 and 8 and therefore description is omitted.

EMBODIMENT 5

Figure 11:
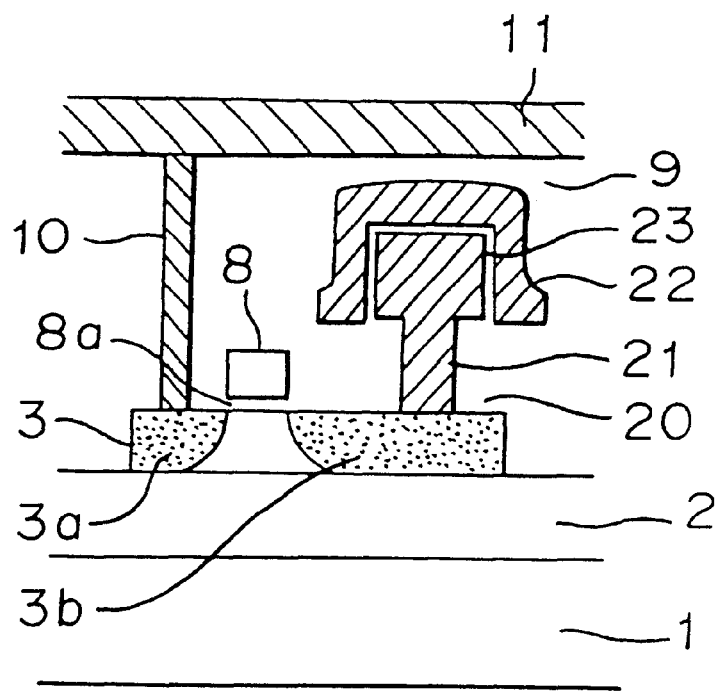
FIG. 11 is a cross-sectional view for schematically showing a semiconductor memory device according to Embodiment 5 of the present invention.
Figure 12:
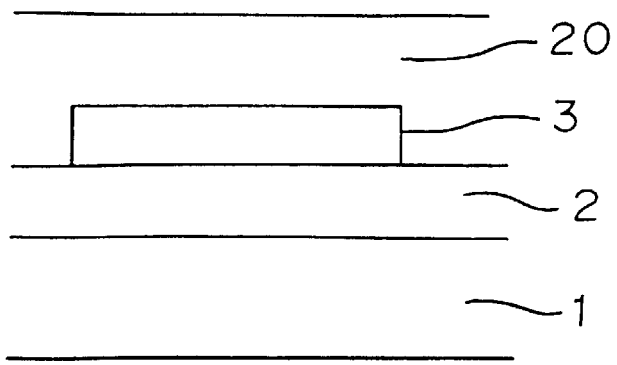
FIGS. 12a through 12c show steps of manufacturing process in a method of manufacturing the semiconductor memory device shown in FIG. 11.
Figure 12:
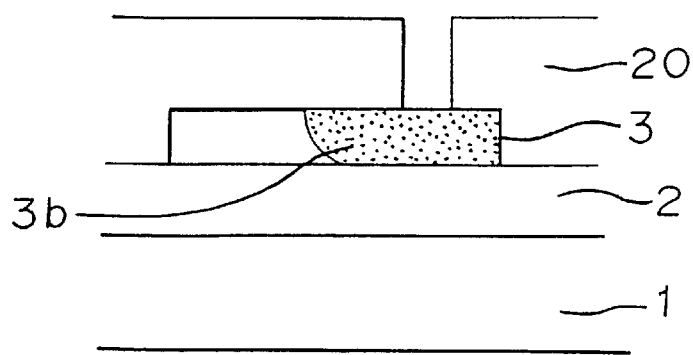
Figure 12:
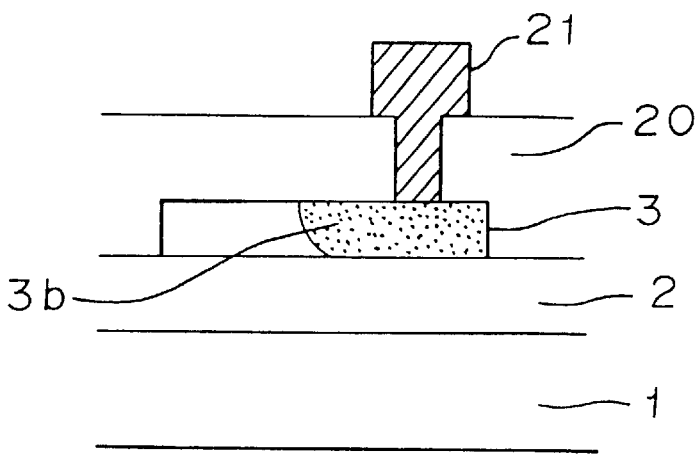
Figure 13:
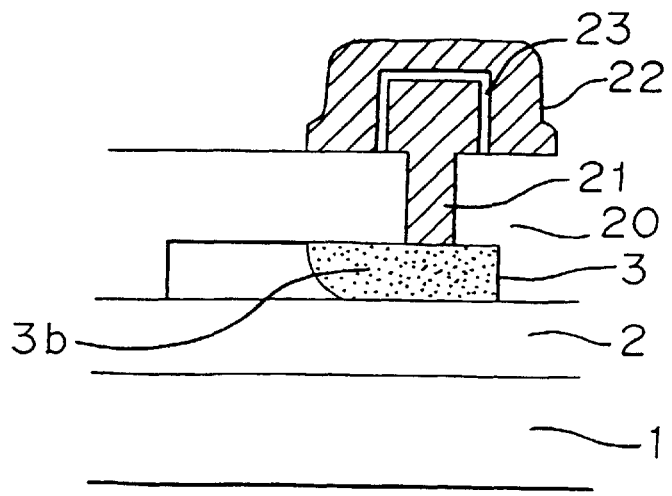
FIGS. 13a through 13c show steps of manufacturing process in the method of manufacturing the semiconductor memory device shown in FIG. 11.
Figure 13:
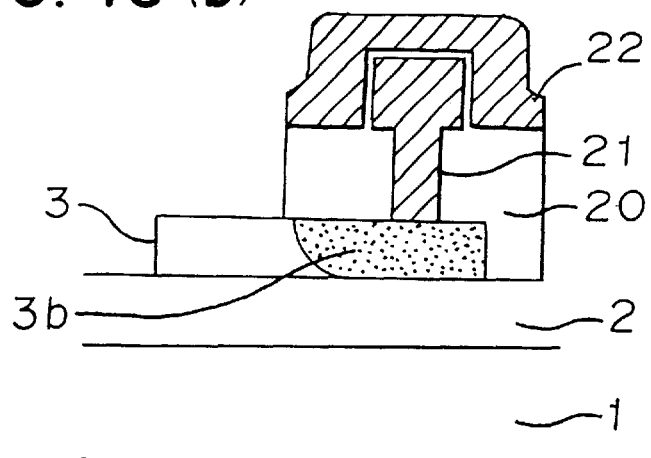
Figure 13:
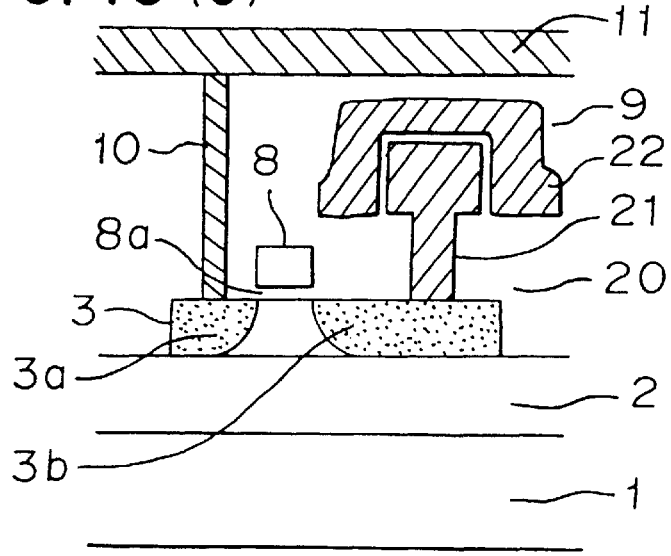
Figure 14A:
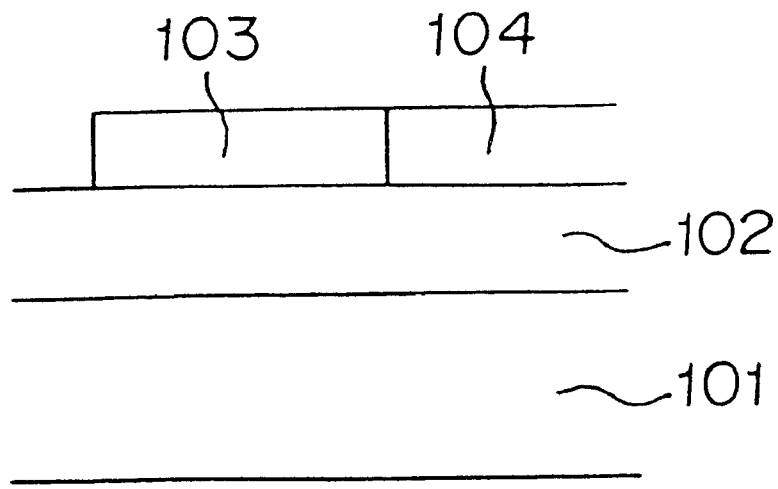
FIGS. 14a and 14b show steps of manufacturing process in a method of manufacturing a conventional semiconductor memory device.
Figure 14B:
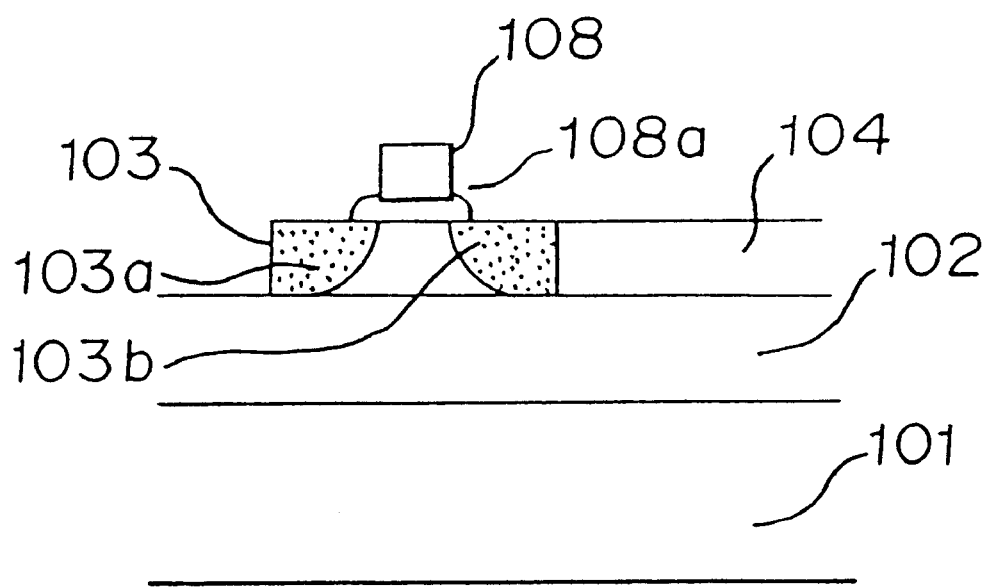
Figure 15A:
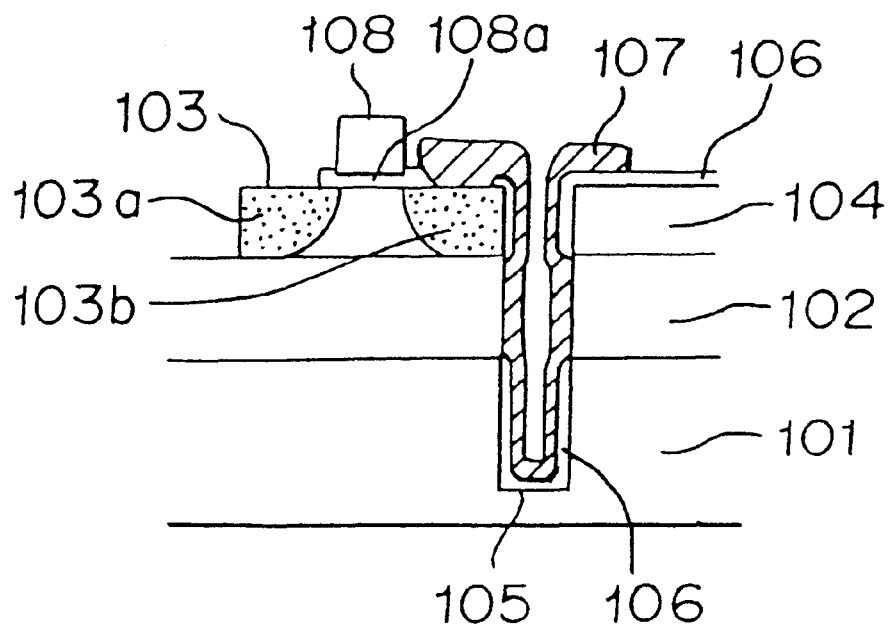
FIGS. 15a and 15b show steps of manufacturing process in a method of manufacturing a conventional semiconductor memory device.
Figure 15B:
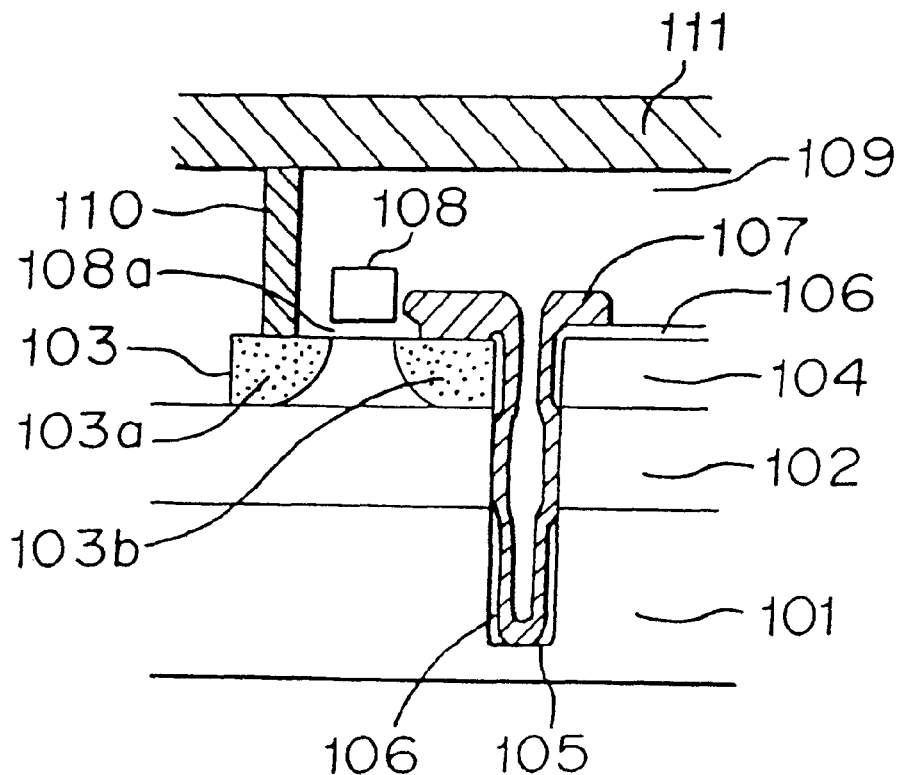

FIG. 11 is a cross-sectional view for schematically showing a semiconductor memory device according to Embodiment 5 of the present invention. FIG. 11 shows an SOI structure in which an insulator 2 made of silicon oxide ($SiO_2$) is formed on a silicon substrate 1 and single crystalline silicon 3 (hereinbelow referred to as an SOI layer) is formed on the insulator 2.

Further, a MOSFET is fabricated by forming source drain areas 3a and 3b on the SOI layer 3 and providing a gate oxide film 8a between the source drain areas and a gate electrode 8 on this gate oxide film 8a. A lightly doped drain (LDD) structure may be adopted by forming regions having low concentration impurities of the same conduction type are formed in ends of the source drain areas 3a and 3b on the side of a gate.

Further, an insulating layer 9 made of silicon oxide or the like is formed on the MOSFET and also a conductive layer 11 made of Al or the like is formed on the insulating layer 9. Additionally, a tungsten plug (W plug) 10 is formed in the insulating layer 9 for making the source drain area 3a of the SOI layer 3 in electrically contact with the conductive layer 11.

Further, a stack-type capacitor is formed by arranging polycrystalline silicon to be a storage node, for example, polysilicon 21, on the SOI layer 3, silicon oxide 23, and a cell plate 22 in a sequential manner. A shape of a cross-sectional view of this stack-type capacitor may be any such as a straw bag-like shape, a barrel-like shape, a cylindrical shape, a column-like shape, and a fin-like shape, wherein the shape is not specifically limited. Further, conductive impurities are injected into the polysilicon 21 to be the storage node so as to give conductivity.

In the next, a method of manufacturing the semiconductor memory device shown in FIG. 11 will be described. FIGS. 12a through 13c show steps of manufacturing process of the semiconductor memory device shown in FIG. 11.

At first, as shown in FIG. 12a, an SOI substrate made by forming an SOI layer 3 of single crystalline silicon on an insulator 2 positioned on a silicon substrate 1 is prepared and a silicon oxide layer 20 is formed on the SOI substrate.

In the next, as shown in FIG. 12b, a part of the silicon oxide layer 20 corresponding to a source drain area of the SOI layer 3 is removed by etching to form a hole portion. Impurities are injected into the source drain area of the SOI layer 3 through the hole portion to form the source drain area 3b.

The impurities to be injected are phosphorus (P), arsenic (As) or the like and a condition for injecting is for example $1 \times 10^{15}/cm^2$, which may be sufficient as long as by which a source drain area for MOSFET is obtainable.

In the next, as shown in FIG. 12c, polysilicon is deposited by a CVD method and thereafter the polysilicon 21 to be a storage node, which is connected to the source drain area 3b of the SOI layer 3 through the hole portion, is formed by an etching process and an etching process. Thus, by forming the polysilicon 21 to be the storage node, the polysilicon 21 to be the storage node is connected to the SOI layer 3 before forming the gate oxide film of the MOSFET formed in the SOI layer 3. Therefore, the polysilicon 21 to be the storage node becomes a gettering site at a time of gettering.

In the next, as shown in FIG. 13a, wet oxidation is conducted under a temperature of 750° C. to form the silicon oxide film 23 having a thickness of about 100 Å on the semiconductor substrate including the polysilicon 21 to be the storage node. Then, polysilicon is deposited by a CVD method and the cell plate 22 is formed by an etching process and an etching process so as to be apart a predetermined distance from the polysilicon 21 to be the storage node interposing the silicon oxide film 23.

In the next, as shown in FIG. 13b, a part of the silicon oxide film 20, other than a part thereof positioned under the cell plate 22, is removed. After forming the polysilicon 21 to be the storage node and before forming the gate oxide film, the semiconductor substrate is subjected to anneal treatment in a range of 600° C. through 1,200° C.

In this Embodiment 5, the anneal treatment is conducted under conditions of an $N^2$ atmosphere, a temperature of 700° C., and an hour. By this anneal treatment, impurities such as heavy metals contained in the SOI layer 3 is gettered by the polysilicon 21 to be the storage node.

Although in this Embodiment 5, the anneal treatment is conducted after removing the part of the silicon oxide film 20 excluding the other part under the cell plate 22, this annealing treatment may be conducted after connecting the polysilicon 21 to the SOI layer 3 and before removing the part of the silicon oxide film 20 as long as it is conducted before forming the gate oxide film.

In the next, as shown in FIG. 13c, a source drain area 3a and a gate oxide film 8a are sequentially formed, and further a gate electrode 8 is formed on the gate oxide film 8a.

After finishing steps of forming the MOSFET, an insulating layer 9 is formed in the semiconductor substrate and succeedingly a W plug 10 is formed in the insulating layer 9 and wiring of conductor 11 such as Al is formed on the insulating layer 9.

Although the semiconductor memory device shown in FIG. 11 is formed as described, the capacitor insulating film may be substituted a silicon oxide film, an oxynitride film, or other materials having a high dielectric constant for the silicon oxide. Further, the storage node may be any such as polysilicon as long as a gettering effect is obtainable.

Because the method of manufacturing the semiconductor memory device according to Embodiment 5, the gettering is conducted by the anneal treatment by making the polysilicon to be the storage node composing the capacitor in contact with the SOI layer before forming the gate oxide film, the gettering can be conducted without specifically forming polycrystalline silicon in the SOI layer or forming a polycrystalline silicon film on the SOI layer, whereby microminiaturization of the element is obtainable.

Further, because the gettering is conducted utilizing the polysilicon to be the storage node, the region of polycrystalline silicon for gettering is sufficiently prepared, whereby it is possible to conduct effective gettering. Further, because the gettering is conducted utilizing the polysilicon to be the storage node, it is not necessary to additionally form polycrystalline silicon, whereby the manufacturing process can be made easy.

Further, because the gettering is conducted by the polysilicon to be the storage node, effects such as reduction of leaks in the gate oxide film, improvement of dielectric breakdown characteristics, and extension of lifetime are obtainable, whereby quality of a semiconductor memory device can be improved.

Further, leaks in a junction between source drain areas and a channel area can be reduced, whereby quality of a semiconductor device can be further improved.

Although, in the above Embodiments, gettering is conducted by anneal treatment, such anneal treatment is not specifically required as long as the gettering is conducted by heat treatment conducted by forming other elements after forming a storage node of a capacitor connected to single crystalline silicon at its end and before forming a gate oxide film.

Although, in the above embodiments, descriptions are mainly based on a structure of a DRAM cell, these are not limited to a DRAM cell and applicable to a semiconductor memory device having a structure including a MOSFET composed of an SOI layer and a gate oxide film formed therein and a capacitor having a storage node connected to the SOI layer.

The first advantage of a method of manufacturing a semiconductor memory device according to the present invention is that gettering becomes possible without newly forming a polycrystalline silicon region for gettering, and microminiaturization of an element and simplification of a manufacturing process become possible. Further, effective gettering can be conducted because it is conducted by a storage node having a sufficient polycrystalline silicon region for gettering.

The second advantage of a method of manufacturing a semiconductor memory device according to the present invention is that an gettering effect can be further enhanced because a storage node is formed like a plug embedded in a trench-type capacitor.

The third advantage of a method of manufacturing a semiconductor memory device according to the present invention is that a gettering effect can be further enhanced because an area for connecting a conductive layer to single crystal is increased when the conductive layer is connected to an upper surface and a side surface of single crystalline silicon.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a semiconductor memory device for forming a MOSFET in single crystalline silicon formed on an insulator and a capacitor having a storage node in the vicinity of said single crystalline silicon comprising the following steps in a sequential manner:

forming said storage node in which a conductive layer to be said storage node is formed in the vicinity of said single crystalline silicon formed on said insulator and said conductive layer is connected to said single crystalline silicon, gettering contaminants contained in said single crystalline silicon by said conductive layer connected to said single crystalline silicon with heat treatment of said single crystalline silicon, and forming a gate oxide film on said single crystalline silicon.

2. A method of manufacturing a semiconductor memory device according to claim 1, wherein the method is to form the semiconductor memory device having the capacitor of a trench-type, in a trench of which said conductive layer to be the storage node is formed.

3. A method of manufacturing a semiconductor memory device according to claim 2, wherein the method is to form the semiconductor memory device having the conductive layer to be the storage node, which is formed in an inner side surface of the trench like a film.

4. A method of manufacturing a semiconductor memory device according to claim 2, wherein the method is to form the semiconductor memory device having the conductive layer to be the storage node, which is embedded in the trench like a plug.

5. A method of manufacturing a semiconductor memory device according to claim 1, wherein the method is to form the semiconductor memory device having the capacitor, which is a stack-type including a conductive layer to be a storage node formed on the single crystalline silicon and an upper electrode formed on the conductive layer so as to be opposite to the conductive layer.

6. A method of manufacturing a semiconductor memory device according to claim 1, wherein the method is to form the semiconductor memory device having the conductive layer to be the storage node, which is connected to a side surface of the single crystalline silicon.

7. A method of manufacturing a semiconductor memory device according to claim 6, wherein the method is to form the semiconductor memory device having the conductive layer to be the storage node, which is additionally connected to an upper surface of the single crystalline silicon.

8. A method of manufacturing a semiconductor memory device for forming a MOSFET in single crystalline silicon formed on an insulator and a capacitor having a storage node in the vicinity of said single crystalline silicon comprising the following steps in a sequential manner:

forming source drain areas by injecting impurities into single crystalline silicon, forming said storage node in which a conductive layer to be said storage node is formed in the vicinity of said single crystalline silicon formed on said insulator and said conductive layer is connected to said single crystalline silicon, gettering contaminants contained in said single crystalline silicon by said conductive layer connected to said single crystalline silicon with heat treatment of said single crystalline silicon, forming a gate oxide film on said single crystalline silicon, and forming a gate electrode on said gate oxide film.

9. A method of manufacturing a semiconductor memory device according to claim 8, wherein the method is to form the semiconductor memory device having the capacitor of a trench-type, in a trench of which the conductive layer to be said storage node is formed.

10. A method of manufacturing a semiconductor memory device according to claim 9, wherein the method is to form the semiconductor memory device having the conductive layer to be the storage node, which is formed in an inner side surface of the trench like a film.

11. A method of manufacturing a semiconductor memory device according to claim 9, wherein the method is to form the semiconductor memory device having the conductive layer to be the storage node, which is embedded in the trench like a plug.

12. A method of manufacturing a semiconductor memory device according to claim 8, wherein the method is to form the semiconductor memory device having the capacitor of a stack-type capacitor, which includes a conductive layer to be a storage node formed on the single crystalline silicon and an upper electrode formed on the conductive layer so as to be opposite to the conductive layer.

13. A method of manufacturing a semiconductor memory device according to claim 8, wherein the method is to form the semiconductor memory device having the conductive layer to be the storage node, which is connected to a side surface of the single crystalline silicon.

14. A method of manufacturing a semiconductor memory device according to claim 13, wherein the method is to form the semiconductor memory device having the conductive layer to be the storage node, which is additionally connected to an upper surface of the single crystalline silicon.

* * * * *